(12) United States Patent
Nam et al.

(10) Patent No.: US 6,877,040 B1
(45) Date of Patent: Apr. 5, 2005

(54) METHOD AND APPARATUS FOR TESTING ROUTABILITY

(75) Inventors: Gi-Joon Nam, Ann Arbor, MI (US); Sandor S. Kalman, Los Gatos, CA (US); Jason H. Anderson, Campbell, CA (US); Rajeev Jayaraman, San Jose, CA (US); Sudip K. Nag, San Jose, CA (US); Jennifer Zhuang, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 657 days.

(21) Appl. No.: 09/624,716

(22) Filed: Jul. 25, 2000

(51) Int. Cl.[7] ............................................. G06F 15/173
(52) U.S. Cl. .................. 709/238; 709/239; 709/240; 709/241; 709/242; 709/243; 709/244; 371/27
(58) Field of Search ..................... 709/238, 239–244; 371/27

(56) References Cited

U.S. PATENT DOCUMENTS

| | | | | |
|---|---|---|---|---|
| 6,038,392 A | * | 3/2000 | Ashar et al. ................... | 703/27 |
| 6,292,916 B1 | * | 9/2001 | Abramovici et al. ........ | 714/736 |
| 6,308,299 B1 | * | 10/2001 | Burch et al. .................... | 716/4 |
| 6,415,430 B1 | * | 7/2002 | Ashar et al. ................... | 716/18 |
| 6,442,732 B1 | * | 8/2002 | Abramovici et al. ........... | 716/4 |
| 6,473,884 B1 | * | 10/2002 | Ganai et al. .................... | 716/3 |

OTHER PUBLICATIONS

R. Glenn Wood and Rob A. Rutenbar IEEE Transaction on (VLSI) systems, vol. 6, No2, Jun. 1998.*
Hung et al. [On segmented Channel Routability, IEEE 2002].*
Kao et al. [A Routability and Performance Driven ehnology Mapping Igorithm for LUT Based FPGA Designs, IEEE 1999].*

J. P. M. Silva and K. A. Sakallah, "GRASP—A New Search Algorithm for Satisfiability", The University of Michigan, Computer Science and Engineering Division, Ann Arbor, Michigan CSE–TR–292–96, Apr. 10, 1996, pp. 79–87.

C. Y. Lee, "An Algorithm for Path Connections and its Applications," IRE Transactions on Electronic Computers, vol. EC=10, 1961, pp. 346–365.

L. McMurchie and C. Ebeling, "PathFinder: A Negotiation-Based Performance–Driven Router for FPGAs," Proc. ACM/SIGDA Int. Symposium on Field Programmable Gate Arrays, 1995, pp. 111–117.

(Continued)

*Primary Examiner*—Jack B. Harvey
*Assistant Examiner*—Mitra Kianersi
(74) *Attorney, Agent, or Firm*—LeRoy D. Maunu; Edel M. Young; Justin Liu

(57) ABSTRACT

A method and apparatus for determining routing feasibility of a plurality of nets. Each net has an associated set of one or more routing solutions, wherein each solution specifies one or more routing resources consumed by the net. A liveness Boolean function is generated having variables that represent respective net/solution pairs. If there exists a set of values for the variables such that at least one of the variables for each net is logically true, then the liveness function is true. An exclusivity function is generated using the variables that represent the net/solution pairs. If there exists at least one set of values for the variables such that no resource is used is by more than a predetermined number of nets, then the exclusivity function is true. The nets are routable using the provided solutions if there is one set of values for the variables such that both the liveness and exclusivity functions are true.

21 Claims, 4 Drawing Sheets

OTHER PUBLICATIONS

Carl Ebeling et al., "Placement and Routing Tools for the Triptych FPGA," IEEE Transactions on Very Large Scale Integration (VLSI) Systems, vol. 3, No. 4, Dec. 1995 pp. 473–482.

G.J. Nam et al., "Resource–Based FPGA Routability Checking Via Boolean Satisfiability," available from Xilinx, Inc. 2100 Logic Drive, San Jose, CA 95124.

G.J. Nam et al., "Satisfiability–based FPGA Detailed Routing," Proceedings of the International Conference on VLSI, Jan. 1999 India.

G.J. Nam et al., "Satisfiability–Based Layout Revisited: Detailed Routing of Complex FPGAs Via Search–Based Boolean SAT," Proceedings ACM International Symposium on FPGAs, Feb. 1999.

R. Glenn Wood and Rob A. Rutenbar, "FPGA Routing and Routability Estimation Via Boolean Satisfiability," Proceedings ACM International Symposium on FPGAs, Feb. 1997.

* cited by examiner

US 6,877,040 B1

METHOD AND APPARATUS FOR TESTING ROUTABILITY

FIELD OF THE INVENTION

The present invention generally relates to analysis of circuit designs, and more particularly to determining the feasibility of routing a plurality of nets on a programmable logic device.

BACKGROUND

The term "net" as used herein refers to an electrical connection between components of a user's circuit design. For example, one net may connect the output terminal of an AND gate to the input terminal of another AND gate and to the input terminal of a flip flop. An AND gate is one component type, and a flip flop is another component type. An "instance" is a single occurrence of a component type. A net connects to a particular pin on a component instance. For example, a clock net is connected to a specific clock pin on a flip-flop component instance. In the context of FPGAs, a pin of a component instance may correspond to the input port of a configurable logic block (CLB), for example. A "netlist" is a list of all the nets which connect the component instances of a user's design and the pins on component instances connected by each net.

The circuit design process generally includes the steps of design entry, synthesis, optimization, device mapping, and place-and-route, along with functional and timing simulations to verify correctness. Determining the feasibility of routing a set of nets given certain constraints may be desirable in several situations in the context of this process. Three examples are provided below. In one example involving a given set of nets, it would be useful for a user to know whether there exists a routing solution for the set of nets such that no two nets are electrically shorted in the solution. If no solution exists, the nets may be restructured prior to place-and-route.

In another example, a user may need to know the feasibility of routing a set of nets given certain timing constraints. Typically, only a subset of the list of all nets are considered to be "timing-critical" nets. For these timing-critical nets, it would be useful to know whether there exists a routing solution that satisfies the timing constraints. It would be desirable if this determination could be made quickly and prior to routing the set of all nets.

In the third example a small change is made to a design. Since the user will not want to disrupt other unchanged and validated sections of the design, it would be useful to determine whether there exists a routing solution for the nets which does not impact the unmodified sections of the design.

An apparatus that addresses the aforementioned problems, as well as other related problems, is therefore desirable.

SUMMARY OF THE INVENTION

The present invention generally relates to determining routing feasibility of a plurality of nets. In various embodiments, an associated set of one or more routing solutions are provided for each net, wherein each solution specifies one or more routing resources consumed by the net. A liveness Boolean function is generated having variables that represent respective net/solution pairs. If there exists a set of values for the variables such that at least one of the variables for each net is logically true, then the liveness function is true. An exclusivity function is generated using the variables that represent the net/solution pairs. If there exists at least one set of values for the variables such that no resource is used by more than a predetermined number of nets, then the exclusivity function is true. The nets are routable using the provided solutions if there exists one set of values for the variables such that both the liveness and exclusivity functions are true.

It will be appreciated that various other embodiments are set forth in the Detailed Description and claims which follow.

BRIEF DESCRIPTION OF THE DRAWINGS

Various aspects and advantages of the invention will become apparent upon review of the following detailed description and upon reference to the drawings in which.

DETAILED DESCRIPTION

Boolean Satisfiability (SAT) is a technique that is used to determine whether there exists a satisfying truth assignment for a Boolean function $\phi$. Generally, SAT refers to solving a function $\phi$ that is expressed in conjunctive normal form (CNF), as known to those skilled in the art. In the logical notation used herein, "&" represents a logical AND, "V" represents a logical OR, and "~" represents a logical NOT.

In one embodiment, the SAT technique is applied to detailed netlist routing on a programmable logic device (PLD). For example, a field programmable gate array (FPGA) is a PLD having configurable signal-routing resources. The nets in a design are realized physically by assigning routing resources to each net, thereby connecting each net to component instances in the desired manner.

Figure 1:
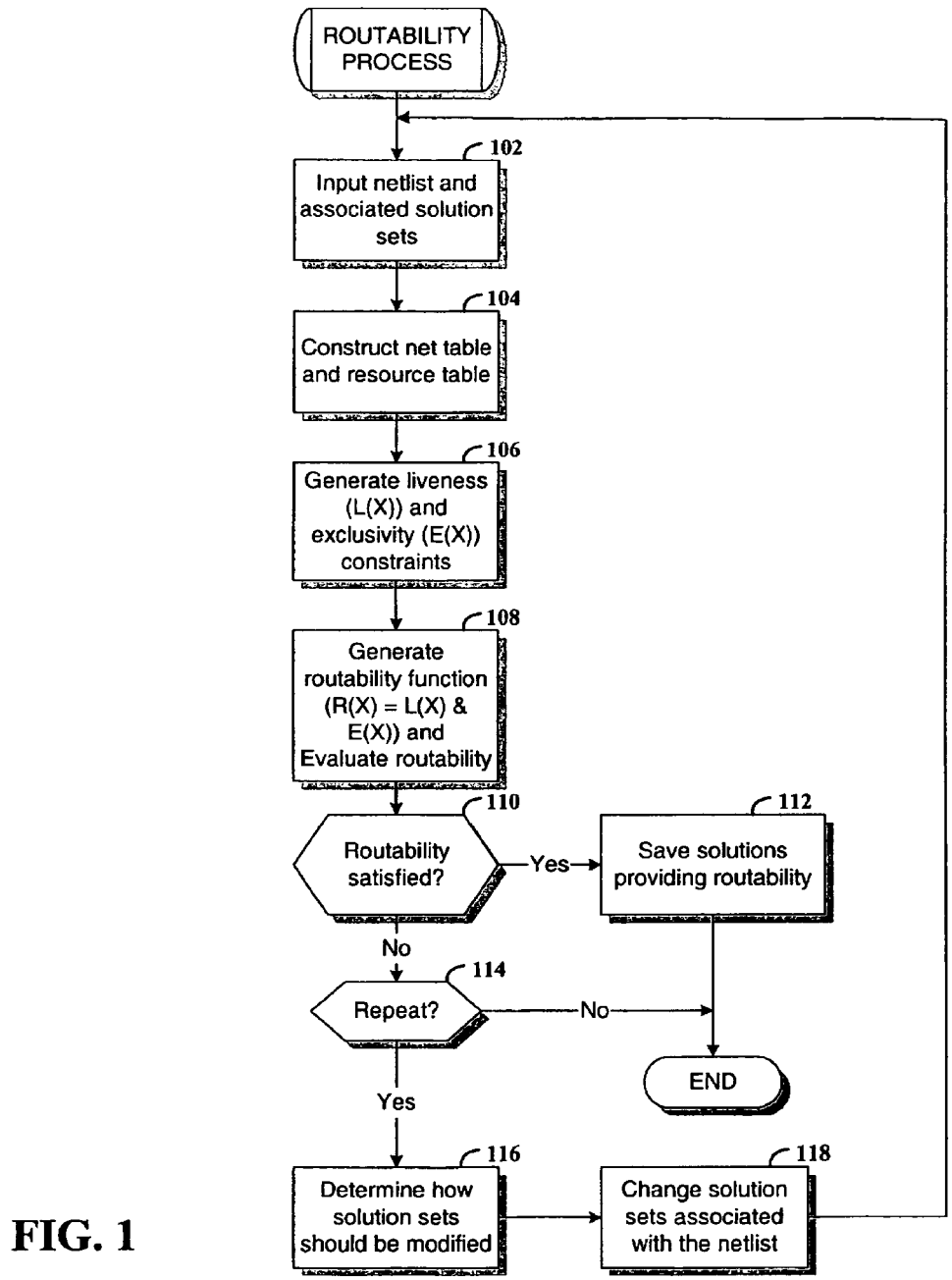
FIG. 1 is a flowchart of a process for determining whether a set of nets is routable given certain routing resource constraints, according to one embodiment of the invention.

FIG. 1 is a flowchart of a process for determining whether a set of nets is routable given certain routing resource constraints, according to one embodiment of the invention. The process generally entails applying the SAT technique to a Boolean function of routability constraints that are generated from input net solutions and the respective routing resources associated with the solutions.

At step 102, the nets comprising the circuit design and the solution sets associated with the nets are input for processing. Each net has associated therewith one or more solutions, each solution comprising an associated set of resources. For example, the resources associated with a particular solution may include the routing resources consumed by the solution.

In one embodiment, the input nets and solution sets can be input in a text file, in which each net has the following format:

```
.net net_name
.sol 1 resource_1 resource_2 . . . resource_i
.sol 2 resource_1 resource_2 . . . resource_i
. . .
.sol m resource_1 resource_2 . . . resource_k
.e
```

The keyword ".net" indicates the beginning of a set of routing solutions for the net having the name net_name. The keywords ".sol" indicate the beginning of the different routing solutions for the net. Each routing solution includes a solution name, for example, "1" and a list of the routing resources used in the solution, for example, resource_ 1–resource_i. The ".e" keyword indicates the end of the routing solutions for the net. Each net in the input file has an entry having the format shown above. Those skilled in the art will recognize that the above format is but one example for inputting the routing solutions and that the routing solutions could be input in another form such as a database.

At step 104, a net table and a resource table are constructed from the input nets and solution sets. Before continuing with the process of FIG. 1, the net table and resource table are described with reference to FIGS. 2 and 3, respectively.

Figure 2:
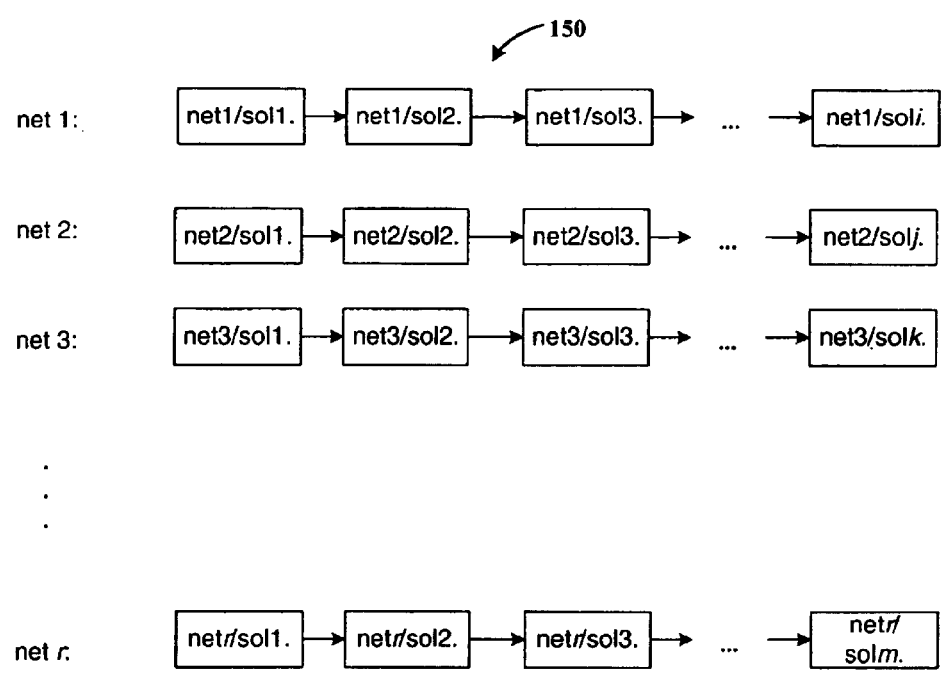
FIG. 2 illustrates an example net table.

FIG. 2 illustrates net table 150. Net table 150 includes rows associated with nets 1-$r$, respectively. Each entry in a row denotes a solution for implementing the net. For example, net 1 has the associated solutions 1-$i$, and net 2 has the associated solutions 1-$j$. Recall from the discussion of the information included in the input constraint file that associated with each of the solutions is a set of resources, for example, the routing resources required in the solution.

For the purpose of formulating net table 150 into a SAT problem, each of the net/solution pairs is assigned a unique Boolean variable. For example, if net 1 referenced as N1, and solutions 1-$i$ are referenced as S1, S2, S3, and Si, respectively, then the Boolean variables associated with net 1 are N1S1, N1S2, N1S3, . . . , N1Si. Note that the notation NiSj represents a single variable.

Figure 3:
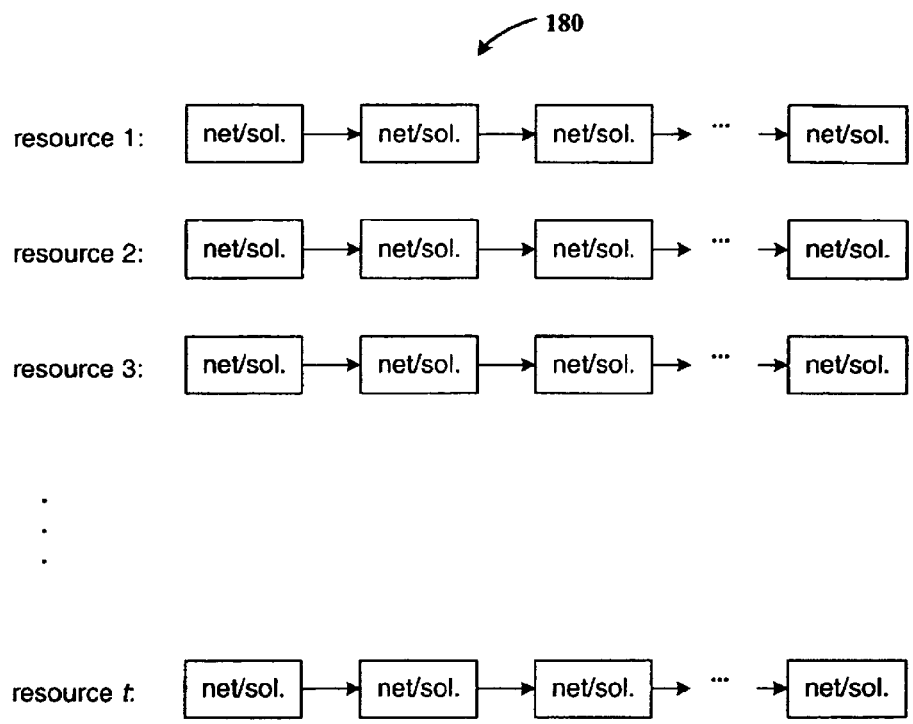
FIG. 3 illustrates an example resource table.

FIG. 3 illustrates a resource table 180. Resource table 180 is comprised of the set of routing resources used by all of the solutions for all of the nets, along with the net/solution pairs using the associated resources. For example, if nets 1-$r$ (FIG. 2) have solutions that require resources 1-$t$, the resource table has respective rows for resources 1-$t$. Each row of resource table 180 provides identification of the net/solution pairs that use the resource associated with the row. One way to identify a net/solution pair is with the associated Boolean variable. Thus, another way to view the rows of the resource table is as lists of Boolean variables that correspond to the net/solution pairs.

Returning now to FIG. 1, the net/solution pairs of table 150 and the net/solution pairs in relation to the resources of FIG. 3 are used to construct a Boolean function to which the SAT technique can be applied. At step 106, "liveness" and "exclusivity" constraints are generated using the Boolean variables representing the net/solution pairs and the resources used in the solutions. The liveness and exclusivity constraints (L(X) and E(X)) are represented in CNF and are conjoined to form the final routability Boolean function (R(X)=L(X) & E(X)). The routability function constructed from the liveness and exclusivity constraints allows application of the SAT technique to determine whether a layout is impossible given the input net solutions.

Before completing the description of FIG. 1, the generation of the liveness and exclusivity constraints will be discussed with reference to FIG. 4.

Figure 4:
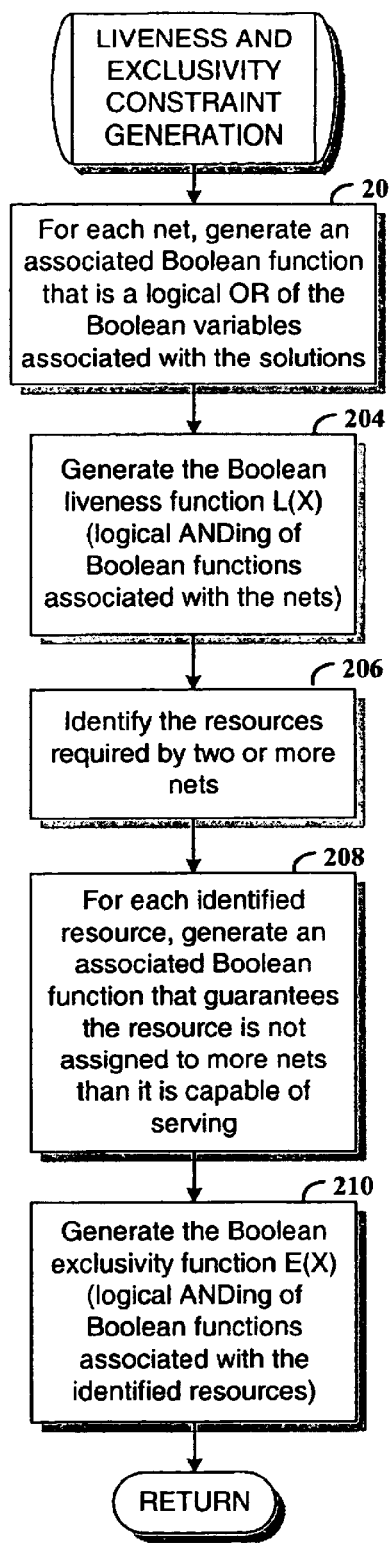
FIG. 4 is a flowchart of a process for generating liveness and exclusivity constraints in accordance with one embodiment of the invention.

FIG. 4 is a flowchart of a process for generating liveness and exclusivity constraints in accordance with one embodiment of the invention. The liveness constraint is constructed to ensure that at least one solution for each of the nets is chosen as a final legal routing solution. The exclusivity constraint is constructed to ensure that no routing resource is used by more nets than it can support.

At step 202, respective Boolean functions are generated for the nets. Each Boolean function is the logical OR of the Boolean variables associated with the solutions that are available for the net. Each solution has a single associated variable. For example, the Boolean function L(1) associated with net 1 of FIG. 2 is written as L(1)=N1S1 V N1S2 V N1S3 V . . . V N1Si. At step 204, the liveness constraint is generated as a Boolean function (L(X)) by logically ANDing the Boolean functions (L(1), L(2), . . . , L(r)) associated with the nets. The liveness function is written as L(X)=L(1) & L(2) & . . . & L(r). Note that L(1), L(2), . . . , L(r) are referred to as Boolean clauses of the Boolean function L(X). Each clause corresponds to a single net.

Steps 206, 208, and 210 are directed to generating the exclusivity constraint in the form of a Boolean function E(X). Exclusivity is directed to ensuring that a resource is not overused by more than one net. Thus, resources that are used in the solutions of two or more nets are identified at step 206 using resource table 180 (FIG. 3). For each combination including two net/solution pairs that are trying to use a particular resource, for example, net i/solution j and net m/solution n, an exclusivity Boolean clause is constructed to indicate that if net i/solution j is to use the resource, then net m/solution n cannot use the same resource. Specifically, ~NiSj V ~NmSn. Note that exclusivity Boolean clauses are constructed only for combinations of net/solution pairs involving different nets, since a combination of net/solution pairs for the same net would not violate exclusive use of the resource. The exclusivity constraint for a resource r (E(r)) is the conjunction of the exclusivity Boolean clauses formed for combinations of net/solution pairs (e.g., E(r)=(~NiSj V ~NmSn) & (~NiSj V ~NmSp).

At step 210, the exclusivity function for the collection of resources (E(X)) is formed with a conjunction of the exclusivity constraints of the individual resources. Thus, E(X)= $E(r_1)$ & $E(r_2)$ & $E(r_3)$ & . . . & $E(r_t)$. The resulting exclusivity function, E(X), is a Boolean function that is in conjunctive normal form (CNF).

It will be appreciated that the present invention can be applied to resources other than routing resources. For example, exclusivity constraints could be used to ensure that no two nets route to the same pin. This is applicable in the context of an FPGA since component instances typically have pins that can be swapped, which leads to a situation in which a net routes to any number of pins but no two nets may route to the same pin. In another application, the resources may be the routing channels of an FPGA instead of specific routing resources. In this case, E(X) is generated to ensure that only a limited number of nets are permitted to route in each channel. The logical relationship between the variables in the exclusivity constraints will vary according to the degree to which a resource can be shared between nets.

After the liveness and exclusivity constraints have been generated, control is returned to step 108 of FIG. 1, to which this description is redirected.

At step 108, the routability function is generated as a conjunction of the liveness and exclusivity constraints (R(X)=L(X) & E(X)). A Boolean satisfiability process is applied to the routability function at step 110 to determine whether the routability function can be satisfied. That is, the Boolean satisfiability process determines whether there is any set of logic values (true or false) for the net/solution variables which would render the routability function logically true. Boolean satisfiability processes are known to those skilled in the art. For example, see J. P. M. Silva and K. A. Sakallah, "GRASP—A New Search Algorithm for Satisfiability," Proc. ACM/IEEE Int. Conference on Computer-Aided Design, November 1996, incorporated herein by reference.

If the routability function can be satisfied, control is directed to step 112 where the net/solution pairs that solve the routability function are saved. It will be appreciated that the net/solution pairs that solve the routability function are those with the associated Boolean variables having the value TRUE.

If two or more solutions have the value TRUE for the same net, only one solution is selected for the final routing. The selection of the solution may be made based on delay and wire length factors associated with the different solutions.

Boolean satisfiability typically finds a single assignment of values to variables that satisfies the Boolean function. However, for a particular set of nets, there may exist multiple solution sets which can be found using different, known heuristic algorithms for Boolean satisfiability. If multiple solution sets are identified, overall delay and wire length considerations may be used to select one desirable solution set.

If the routability function cannot be satisfied, decision step 114 tests whether the routability process should be repeated with new solution sets. In one embodiment, the routability process continues a selected number of iterations. Alternatively, the routability process can be user controlled and the process stopped at the user's request. In another embodiment, the criteria for stopping the routability process considers the number of solutions provided for each net. For example, initially, a subset of all the available solutions are input to the process. If the routability is not satisfied with the initial set, the number of solutions can be increased for nets that are likely to be impeding the finding of a solution. The process can be repeated until a maximum number of solutions is reached or all possible solutions have been considered.

If the routability process is to continue, control is directed to step 116 to determine how to modify the solution sets. One way to modify the solution sets is through an analysis of the liveness function. For the liveness function to evaluate to TRUE, each of its constituent clauses must evaluate to TRUE. Since each liveness clause corresponds to a single net, the number of solutions for a net could be increased if the net's liveness clause could not be satisfied. At step 118, the solution sets are changed. In one embodiment, the results of the analysis performed at step 116 are used in step 118 to generate additional solutions for selected ones of the nets. In another embodiment, the solution sets of all the nets are modified. Solutions for the nets can be generated automatically using known routing algorithms. For example, see C. Y. Lee, "An Algorithm for Path Connections and its Applications," IRE Transactions on Electronic Computers, Vol. EC=10, 1961, pp. 346–365, and L. McMurchie and C. Ebeling, "PathFinder: A Negotiation-Based Performance-Driven Router for FPGAs," Proc. ACM/SIGDA Int. Symposium on Field Programmable Gate Arrays, 1995, pp. 111–117, both incorporated herein by reference. Once the set of solutions has been changed, processing continues at step 102 to check for routability using the new set of solutions.

The following example illustrates the process of transforming routability constraints into a SAT problem. Consider the following example input file:

.net net1
.sol 1 res1 res2 res3
.sol 2 res1 res4 res3
.sol 3 res1 res5 res6 res3
.e
.net net2
.sol 1 res2 res6 res5
.sol 2 res2 res3 res5
.e The input file includes two different nets, net1, and net2, which have three and two different solutions, respectively. Each of the different solutions includes the specified ones of the resources res1–res6.

From the input file, the following net table is constructed:

net1: net1/sol1->net1/sol2->net1/sol3
net2: net2/sol1->net2/sol2

The following resource table is also constructed from the input file:

res1: net1/sol1->net1/sol2->net1/sol3
res2: net1/sol1->net2/sol1->net2/sol2
res3: net1/sol1->net1/sol2->net1/sol3->net2/sol2
res4: net1/sol2
res5: net1/sol3->net2/sol1->net2/sol2
res6: net1/sol3->net2/sol1

A first step of the transformation process is the assignment of a Boolean variable to each net/solution pair, as explained above. It will be appreciated that the number of Boolean variables generated is O(n), where n is the number of net/solution pairs.

The liveness function for the input file is:

L(X)=L(net1) & L(net2)

where L(net1) and L(net2) in terms of the Boolean variables are:

L(net1)=N1S1 V N1S2 V N1S3
L(net2)=N2S1 V N2S2

The exclusivity function for the input file is:

E(X)=E(res2) & E(res3) & E(res5) & E(res6)

where E(res2), E(res3), E(res5), and E(res6) in terms of the Boolean variables are:

E(res2)=(~N1S1 V ~N2S1) & (~N1S1 V ~N2S2)
E(res3)=(~N1S2 v ~N2S2) & (~N1S1 V ~N2S2) & (~N1S3 V ~N2S2)
E(res5)=(~N1S3 V ~N2S1) & (~N1S3 V ~N2S2)
E(res6)=~N1S3 V ~N2S1

Since resource res1 is used only in the solutions for net net1, an exclusivity constraint is unnecessary for res1. Similarly, since res4 is used only by the net1/sol2 pair, an exclusivity constraint is unnecessary for res4.

The final routability function is R(X)=L(X) & E(X). Application of the Boolean satisfiability process results in the equation evaluating to true where N1S1=false, N1S2=true, N1S3=false, N2S1=true, and N2S2=false. In other words, the nets are routable using solution sol2 for net net1 and using solution sol1 for net net2.

The present invention is believed to be applicable to a variety of processes for implementing circuit designs and has been found to be particularly applicable and beneficial in PLDs. While the present invention is not so limited, an appreciation of the present invention has been provided by way of specific example nets and routing resources of PLDs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for determining routing feasibility of routing solutions for a plurality of nets, each solution using one or more routing resources, comprising:

generating a first Boolean function with variables representing respective net/solution pairs, wherein each net has an associated set of one or more routing solutions, at least one of the nets has a plurality of routing solutions, and the first function evaluates to true if there exists a set of values for the variables such that at least one of the variables for each net is logically true;

generating a second Boolean function using the variables that represent the net/solution pairs, wherein the second function evaluates to true if there exists at least one set of values for the variables such that no resource is used by more than a predetermined number of nets; and outputting a signal indicating whether there exists at least one set of values for the variables for which the first function and the second function evaluate to true.

2. The method of claim 1, further comprising representing the first and second Boolean functions in conjunctive normal form.

3. The method of claim 2, further comprising applying Boolean satisfiability to first and second functions.

4. The method of claim 1, wherein the resources comprise signal routing resources of a field programmable gate array.

5. The method of claim 1, further comprising generating a net table including respective sets of solutions associated with the nets.

6. The method of claim 5, further comprising generating the first function from the net table.

7. The method of claim 5, further comprising generating a resource table including respective sets of net/solution pairs associated with the resources, wherein each net/solution pair associated with a resource represents usage of the resource by the net/solution pair.

8. The method of claim 7, further comprising generating the second function from the resource table.

9. The method of claim 1, wherein the predetermined number of nets that can use a resource is 1.

10. The method of claim 1, further comprising saving as a routing solution the at least one set of values for the variables for which the first function and the second function evaluate to true.

11. The method of claim 1, wherein if there exists no set values for the variables for which first and second functions evaluate to true, then performing the steps of:

modifying one or more selected sets of the routing solutions; and repeating the steps of generating first and second functions and outputting the signal.

12. The method of claim 11, further comprising adding additional sets of routing solutions.

13. The method of claim 12, wherein the repeating step continues until predetermined criteria are met.

14. An apparatus for determining routing feasibility of routing solutions for a plurality of nets, each solution using one or more routing resources, comprising:

means for generating a first Boolean function with variables representing respective net/solution pairs, wherein each net has an associated set of one or more routing solutions, at least one of the nets has a plurality of routing solutions, and the first function evaluates to true if there exists a set of values for the variables such that at least one of the variables for each net is logically true;

means for generating a second Boolean function using the variables that represent the net/solution pairs, wherein the second function evaluates to true if there exists at least one set of values for the variables such that no resource is used is by more than a predetermined number of nets; and means for outputting a signal indicating whether there exists at least one set of values for the variables for which the first function and the second function evaluate to true.

15. A computer-implemented method for determining routing feasibility of a plurality of nets sharing a plurality of resources, comprising:

inputting respective sets of one or more solutions associated with the plurality of nets, at least one of the nets having a plurality of routing solutions, and each solution being associated with one or more required resources assigning respective identifiers to net/solution pairs;

generating respective Boolean liveness functions for the nets using the net/solution pairs;

generating respective Boolean exclusivity functions using the net/solution pairs for each resource required by two or more nets;

generating a routability Boolean function as a logical AND of the liveness functions and exclusivity functions; and testing whether the routability function can be satisfied.

16. The method of claim 15, further comprising generating a net table including respective sets of solutions associated with the nets.

17. The method of claim 16, further comprising generating the liveness functions from the net table.

18. The method of claim 15, further comprising generating a resource table including respective sets of net/solution pairs associated with the resources, wherein each net/solution pair associated with a resource represents usage of the resource by the net/solution pair.

19. The method of claim 18, further comprising generating the exclusivity functions from the resource table.

20. The method of claim 15, further comprising representing the liveness and exclusivity functions and the routability function in conjunctive normal form.

21. The method of claim 15 further comprising applying Boolean satisfiability to the routability function.

\* \* \* \* \*